United States Patent [19]

Inoue

[11] Patent Number: 5,689,729
[45] Date of Patent: *Nov. 18, 1997

[54] STORAGE SUBSYSTEM HAVING PLURALITY OF ACCESS PATHS PERMITTING INDEPENDENT ACCESS TO CACHE MEMORY FROM HOST AND INDEPENDENT ACCESS TO THE CACHE FROM ROTATING STORAGE DEVICE

[75] Inventor: Yasuo Inoue, Odawara, Japan

[73] Assignee: Hitachi, Ltd., Tokyo, Japan

[*] Notice: The term of this patent shall not extend beyond the expiration date of Pat. No. 5,459,856.

[21] Appl. No.: 502,045

[22] Filed: Jul. 13, 1995

Related U.S. Application Data

[63] Continuation of Ser. No. 984,763, Dec. 3, 1992, Pat. No. 5,459,856.

[30] Foreign Application Priority Data

Dec. 6, 1991 [JP] Japan ................................. 3-322965

[51] Int. Cl.⁶ .................................................. G06F 15/02
[52] U.S. Cl. .................................................. 395/872
[58] Field of Search ........................... 395/403, 404, 395/405, 427, 182.03, 840, 841, 851, 858, 440–441, 445, 872, 894, 250

[56] References Cited

U.S. PATENT DOCUMENTS

| | | | |
|---|---|---|---|
| 4,021,784 | 5/1977 | Kimlinger | 395/552 |
| 4,394,732 | 7/1983 | Swenson | 395/440 |
| 4,467,414 | 8/1984 | Akagi et al. | 395/250 |
| 4,723,223 | 2/1988 | Hanada | 395/846 |
| 4,792,898 | 12/1988 | McCarthy et al. | 395/445 |
| 4,920,478 | 4/1990 | Faruya et al. | 395/463 |
| 4,996,641 | 2/1991 | Talgam et al. | 395/445 |
| 5,019,971 | 5/1991 | Lefsky et al. | 395/250 |
| 5,073,851 | 12/1991 | Masterson et al. | 395/467 |
| 5,123,099 | 6/1992 | Shibata et al. | 395/447 |
| 5,124,987 | 6/1992 | Milligan et al. | 395/182.05 |
| 5,133,060 | 7/1992 | Weber et al. | 395/440 |
| 5,142,627 | 8/1992 | Elliot et al. | 395/825 |
| 5,150,465 | 9/1992 | Bush et al. | 395/834 |
| 5,155,845 | 10/1992 | Beal et al. | 395/182.04 |
| 5,175,842 | 12/1992 | Totani | 395/488 |
| 5,204,836 | 4/1993 | Reed | 371/10.2 |
| 5,210,843 | 5/1993 | Ayers | 395/455 |
| 5,228,135 | 7/1993 | Ikumi | 395/458 |
| 5,253,351 | 10/1993 | Yamamoto et al. | 395/445 |
| 5,257,359 | 10/1993 | Blasco et al. | 395/465 |
| 5,269,019 | 12/1993 | Peterson et al. | 395/621 |
| 5,287,480 | 2/1994 | Wahr | 395/458 |
| 5,325,488 | 6/1994 | Carteau et al. | 395/821 |
| 5,459,856 | 10/1995 | Inoue | 395/440 |
| 5,519,831 | 5/1996 | Holzhammer | 395/182.2 |

OTHER PUBLICATIONS

Ohmsha, Ltd. and Springer–Verlag, "A Multiport Page–Memory Architecture and a Multiport Disk–Cache System", New Generation Computing 2 (1984), pp. 241–260.

*Primary Examiner*—Moustafa M. Meky
*Attorney, Agent, or Firm*—Kenyon & Kenyon

[57] ABSTRACT

A plurality of independent cache units and nonvolatile memory units are provided in a disk controller located between a host (central processing unit) and a magnetic disk drive. A plurality of channel units for controlling the data transfer to and from the central processing unit and a plurality of control units for controlling the data transfer to and from the magnetic disk drive are independently connected to the cache units and the nonvolatile memory units through data buses and access lines.

12 Claims, 6 Drawing Sheets

DATA BUS PROTOCOL

FIG. 4

DATA BUS MODE

| DUOUT/xDTIN | CMD/xDT | BUS MODE |
|---|---|---|
| 1 | 1 | TRANSFER COMMAND |
| 1 | 0 | TRANSFER WRITE DATA |
| 0 | 1 | TRANSFER STATUS |
| 0 | 0 | TRANSFER READ DATA |

STORAGE SUBSYSTEM HAVING PLURALITY OF ACCESS PATHS PERMITTING INDEPENDENT ACCESS TO CACHE MEMORY FROM HOST AND INDEPENDENT ACCESS TO THE CACHE FROM ROTATING STORAGE DEVICE

This application is a continuation of application Ser. No. 07/984,763, filed Dec. 03, 1992, now U.S. Pat. No. 5,459,856.

BACKGROUND OF THE INVENTION

The present invention relates to an external storage subsystem, and more particularly to a technology effective for an improvement of reliability of an external storage subsystem having a cache function.

For example, in a magnetic disk subsystem used as an external storage in a general purpose computer system, a well-known cache memory comprising a semiconductor memory is interleaved at a portion of a disk controller to avoid as much as possible the reduction of a data transfer rate due to a mechanical factor such as a rotational delay time or a latency time in a magnetic disk drive.

A cache structure in such a disk controller is discussed in "A Multiport Page-Memory Architecture and A Multiport Disk-Cache System" New Generation Computing 2 (1984) 241-260 OHMSHA, LTD. and Springer-Verlag, in which it is proposed to improve an access performance to the cache by dividing it into a plurality of memory banks. Further, a switching network, called an interconnection network is proposed as a system for coupling the memory banks and a channel or a disk controller.

The conventional technology described above intends to improve the cache performance by providing a plurality of memory banks and the switching network. The switching network system called the interconnection network provides the bus structure in the disk controller. However, the switching network system is imparted with a hardware restriction when a data bus configuration for exchanging data is to be constructed by connecting a plurality of memory banks and a plurality of channel units or a plurality of control units.

Typically such a configuration does not take in account the nature of the cache unit comprising the memory banks.

SUMMARY OF THE INVENTION

The present invention provides a data bus structure for connecting a plurality of cache units of a host and a plurality of channel units or a plurality of control units of a rotating storage, by taking restrictive conditions of a data transfer rate and a data bus width on hardware into consideration.

The present invention also provides an external memory subsystem which has a high tolerance to failures and has a highly reliable cache function.

The above and other features of the present invention will be apparent from the following description of the present invention when taken in conjunction with the attached drawings.

Representative features of the present invention are briefly explained below,

The external storage subsystem of the present invention comprises a rotating storage for storing data to be accessed from a host and an external memory control unit having a cache mechanism for responding to an access request from the host to the rotating storage by temporarily holding data exchanged between the rotating storage and the host and having at least one of a non-volatile (persistent) semiconductor memory and a volatile (non-persistent) semiconductor memory as a storage medium. It further comprises a plurality of independent cache mechanisms and a plurality of independent access paths for permitting independent accesses from the host and the rotating storage to the respective cache mechanisms.

In the external storage subsystem of the present invention, the external memory control unit comprises a plurality of channel units for controlling the transfer of data to and from the host and a plurality of control units for controlling the transfer of data to and from the rotating storage, and each of the channel units and the control units has a plurality of first access paths to which a plurality of cache mechanisms are to be independently connected.

In the external storage subsystem of the present invention, the external memory control unit comprises a plurality of channel units for controlling the transfer of data to and from the host and a plurality of control units for controlling the transfer of data to and from the rotating storage, and each of the cache mechanisms has a plurality of the second access paths to which the channel units and the control units are to be connected.

In the external storage subsystem of the present invention, the external memory control unit comprises a plurality of channel units for controlling the transfer of data to and from the host, a plurality of control units for controlling the transfer of data to and from the rotating storage, and a plurality of independent third access paths to the channel units, the control units and the cache mechanisms. The respective channel units, control units and cache mechanisms are connected to the third access paths.

In the external storage subsystem of the present invention, the external memory control unit comprises a plurality of channel units for controlling the transfer of data to and from the host, a plurality of control units for controlling the transfer of data to and from the rotating storage, and fourth access paths for directly and independently connecting the respective channel units and control units with the respective cache mechanisms.

In the external storage subsystem of the present invention, since the cache units are multiplexed and the access paths to the respective cache units by the host and the rotating storage are of independent configuration, the data transfer rate or the data bus width can be optimized by combining a plurality of cache units and a plurality of channel units or a plurality of control units.

Further, since the cache units and the access paths to the cache units are multiplexed, a probability of maintaining the cache function in case a trouble occurs is enhanced and the reliability of the external storage subsystem and the tolerance to failures are certainly improved.

The effects of the representative features of the present invention are as follows.

In the external storage subsystem of the present invention, the cache units in the external storage subsystem including the rotating storage can be coupled, in a simple construction, to the channel units of the host and the control units of the rotating storage. Accordingly, the cache function and performance in the disk control unit are improved.

Further, in the external storage subsystem of the present invention, since both the cache units and the access paths to the cache units are multiplexed, the tolerance to failures is high and the highly reliable cache function is attained.

DETAILED

One embodiment of the external memory subsystem of the present invention is explained with reference to the drawings.

Figure 1:
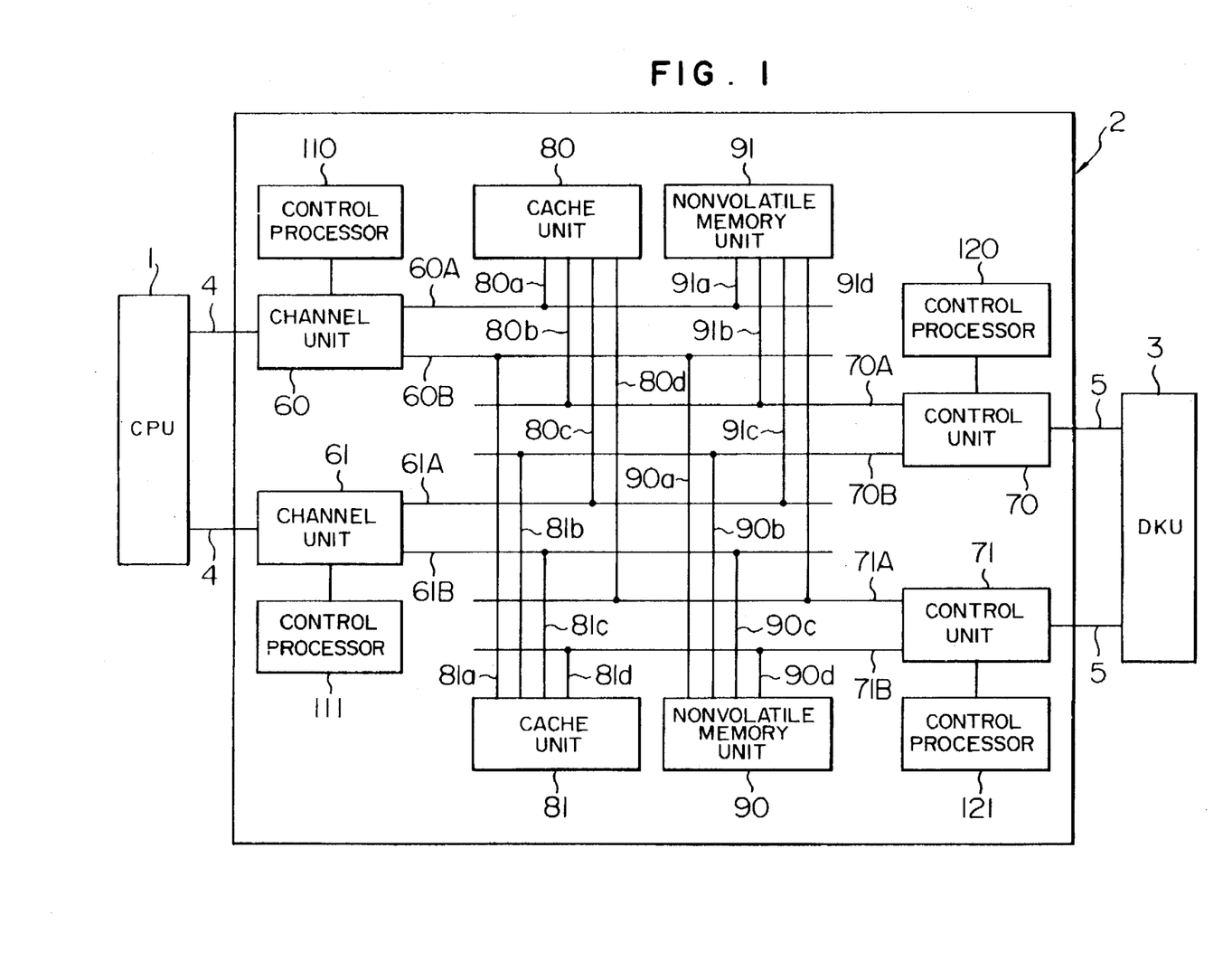
FIG. 1 shows a block diagram of one embodiment of an external storage subsystem of the present invention.

As shown in FIG. 1, a computer system of the present embodiment comprises a central processing unit (CPU) 1 and a disk subsystem which includes a disk controller 2 and a magnetic disk drive 3.

The CPU 1 and the disk controller 2 are connected through a plurality of channel interfaces 4, and the disk controller 2 and the magnetic disk drive 3 are connected through a plurality of control interfaces 5.

The CPU 1 issues an access command to the disk controller 2 through the channel interface 4. The disk controller 2 controls the read and write of data by the magnetic disk drive 3 through the control interface 5 in accordance with the access command from the CPU 1. Thus, the CPU 1 controls the read and write of data by controlling the magnetic disk drive 3 indirectly through the disk controller 2 in accordance with the access command.

In the disk controller 2, a plurality of channel units 60, and channel units 61 which operate under a channel control processor 110 and a channel control processor 111 respectively are provided on the side of the channel interface 4. Also control unit 70 and control unit 71, which operate under a control unit control processor 120 and a control unit control processor 121 respectively are provided on the side of the control interface 5.

A command issued from the CPU 1 to the disk controller 2 is accepted by the channel units 60 and 61, decoded by the channel control processors 110 and 111 and delivered to the control unit processors 120 and 121 necessary for controlling the magnetic disk drive 3. The control unit processors 120 and 121 control the magnetic disk drive 3 through the control units 70 and 71.

The disk controller 2 includes two independent cache units 80 and 81 for temporarily storing data in a semiconductor memory as a storage medium; which is not described in the figure) and two independent nonvolatile memory units 90 and 91. The nonvolatile memory units 90 and 91 are rewritable memories and have a capability of holding data for a certain time period without regard to the presence or absence an external power supply.

A capacity of each of the cache units 80 and 81, for example, is determined to permit a sufficient individual cache operation compatible to a memory capacity of the magnetic disk drive 3. Similarly, a capacity of each of the nonvolatile memory units 90 and 91, for example, is determined to permit a sufficient individual cache operation compatible to the memory capacity of the magnetic disk drive 3.

The channel unit 60 is provided with a plurality of independent data buses 60A and 60B. The cache unit 80 and the nonvolatile memory unit 91 are independently connected to the data bus 60A through the respective access lines 80a and 91a. The cache unit 81 and the nonvolatile memory unit 90 are connected to the data bus 60B through the respective access lines 81a and 90a.

Similarly, the channel unit 61 is provided with a plurality of independent data buses 61A and 61B. The cache unit 80 is connected to the data bus 61A through an access line 80c, and the nonvolatile memory unit 91 is connected through an access line 91c. The cache unit 81 is connected to the data bus 61B through an access line 81c and the nonvolatile memory unit 90 is connected through an access line 90c.

The control unit 70 is provided with a plurality of independent data buses 70A and 70B. The cache unit 80 is connected to the data bus 70A through an access line 80b, and the nonvolatile memory unit 91 is connected through an access line 91b. The cache unit 81 is connected through an access line 81b and the nonvolatile memory unit 90 is connected through an access line 90b.

Similarly, the control unit 71 is provided with a plurality of independent data buses 71A and 71B. The cache unit 80 is connected to the data bus 71A through an access line 80d and the nonvolatile memory unit 91 is connected through an access line 91d. The cache unit 81 is connected to the data bus 71B through an access line 81d and the nonvolatile memory unit 90 is connected through an access line 90d.

In the configuration of the present embodiment, each of the channel units 60 and 61 and the control units 70 and 71 can access the cache units 80 and 81 and the nonvolatile memory units 90 and 91 through independent paths.

An operation of the external memory subsystem of the present embodiment is explained below.

Write data sent from the CPU 1 to the disk controller 2 is temporarily stored in one of the cache unit 80 and 81 and the nonvolatile memory unit 90 and 91 through the channel unit 60 or 61 and one of the data buses 60A, 60B, 61A and 61B, in accordance with the command from the channel control processor 110 or 111. Then, the data is read from one of the cache units 80 and 81 or one of the nonvolatile memory units 90 and 91 by the command from the control unit control processor 120 or 121 and the write data is stored in the magnetic disk drive 3 through the data bus between 70A and 71B (70A to 71B) and the control unit 70 or 71.

On the other hand, when the channel control processor 110 or 111 receives a data read request from the CPU 1 through the channel unit 60 or 61, it searches the contents of the cache unit 80 or 81 and the nonvolatile memory unit 90 or 91, and if there is data requested by the CPU 1, it sends the read data from the cache unit 80 or 81 or the nonvolatile memory unit 90 or 91 through one of the data buses between 60A and 61B (60A to 61B) and the channel unit 60 or 61.

If the data requested by the CPU 1 is not present in any of the cache units 80 and 81 and the nonvolatile memory units 90 and 91, the channel control processor 110 or 111 conveys the data read from the magnetic disk drive 3 to the control unit control processor 120 or 121. When the control unit control processor 120 or 121 receives the data read request from the channel control processor 110 or 111, it stores the requested data read from the magnetic disk drive 3 into one of the cache unit 80 or 81 through the control unit 70 or 71 and the data bus between 70A and 71B (70A to 71B).

When the channel control processor 110 or 111 receives a report of completion of read data stored into the cache unit 80 or 81 from the control unit control processor 120 or 121, it reports the completion of data to the CPU 1 and sends the read data from the cache unit 80 or 81 to the CPU 1 through the data bus between 60A and 61B (60A to 61B) and the channel unit 60 or 61 in response to the command from the CPU 1.

Figure 2:
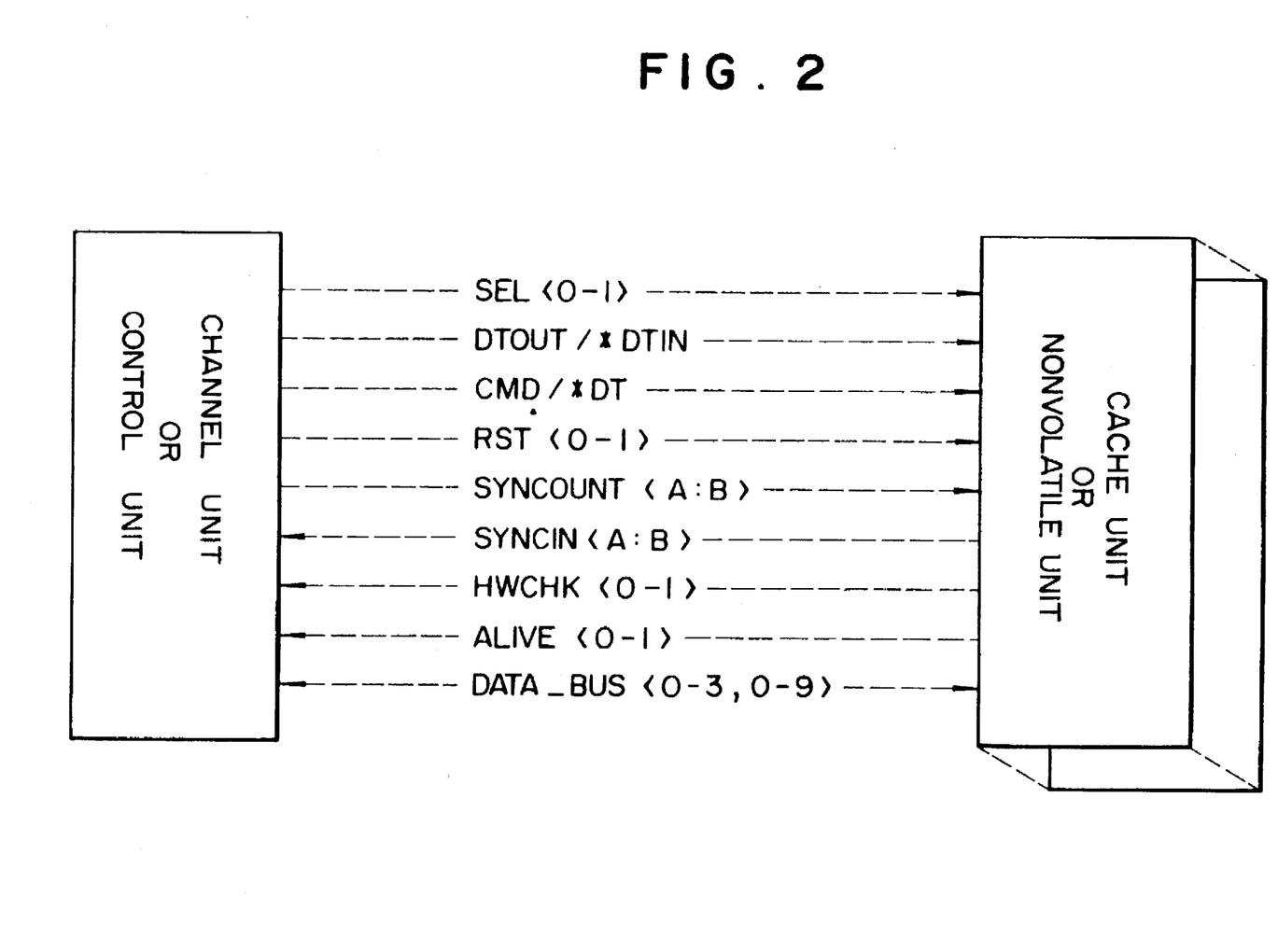
FIG. 2 shows a signal configuration of a data bus connecting a channel unit or control unit in a disk controller and a plurality of cache units or nonvolatile memory units.

FIG. 2 shows an example of signal configuration of the data buses from 60A through 71B connecting the channel units 60 and 61 or the control units 70 and 71 and the cache units 80 and 81 or the nonvolatile memory units 90 and 91 in the disk controller 2. In the present embodiment, the channel units 60 and 61 or the control units 70 and 71 perform a master operation to the cache units 80 and 81 and the nonvolatile memory units 90 and 91. The cache units 80 and 81 or the nonvolatile memory units 90 and 91 perform a slave operation to the channel units 60 and 61 or the control units 70 and 71.

Figure 3:
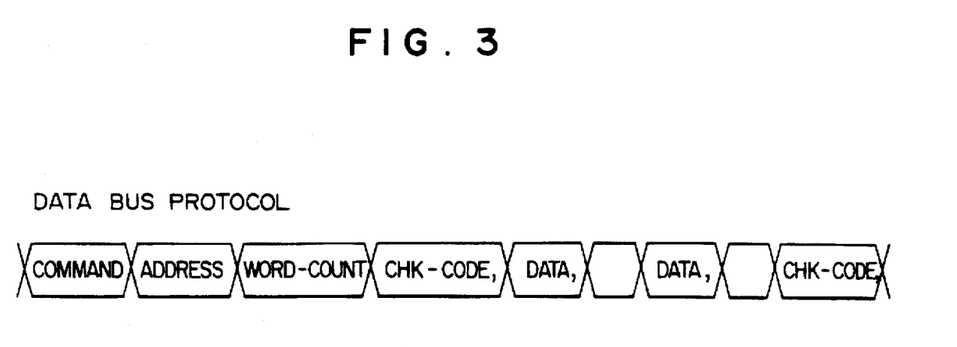
FIG. 3 shows a conceptual view of data bus protocol when read data, write data and command status are exchanged between the channel unit or the control unit and the cache units or the nonvolatile memory units.
Figure 4:
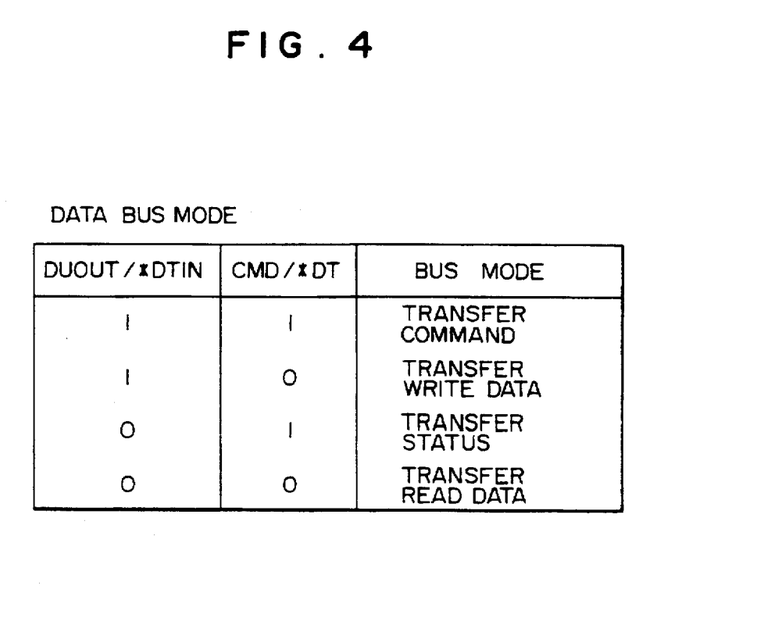
FIG. 4 illustrates a data bus mode for specifying a status of a data bus.

The channel units 60 and 61 or the control units 70 and 71 select the cache unit 80 or 81 or the nonvolatile memory unit 90 or 91 by driving a SEL (0–1) signal line. The channel unit 60 or 61 or the control unit 70 or 71 specifies a status of the data buses from 60A through 71B, by a combination of the signals shown in FIG. 4, of a DTOUT/*DTIN signal line and a CMD/*DTIN signal line in the selected condition of the cache units 80 and 81 or the nonvolatile memory units 90 and 91. The read data, write data, command and status are exchanged between the channel units 60 and 61 or the control units 70 and 71 and the cache units 80 and 81 or the nonvolatile memory units 90 or 91, in accordance with the data bus protocol shown in FIG. 3.

In the external storage subsystem of the present embodiment, the cache units 80 and 81 and the nonvolatile memory units 90 and 91 are independently provided, and the accesses to the cache units 80 and 81 and the nonvolatile memory units 90 and 91 from the channel units 60 and 61 on the side of the CPU 1 and the control units 70 and 71 of the magnetic disk device 3 are permitted independently through the data buses 60A–71B, the access lines 80a to 80d, 81a to 81d, 90a to 90d and 91a–91d. Accordingly, the data transfer rate and the data bus width in the data bus or the access line can be optimally set.

Further, even if a failure occurs in any of the cache units 80 and 81 and the nonvolatile memory units 90 and 91 or the data buses 60A–71B or further the access lines 80a–80d, 81a–81d, 90a–90d and 91a–91d, the cache function can be maintained and the tolerance to the failures and the reliability of the operation are improved.

Figure 5:
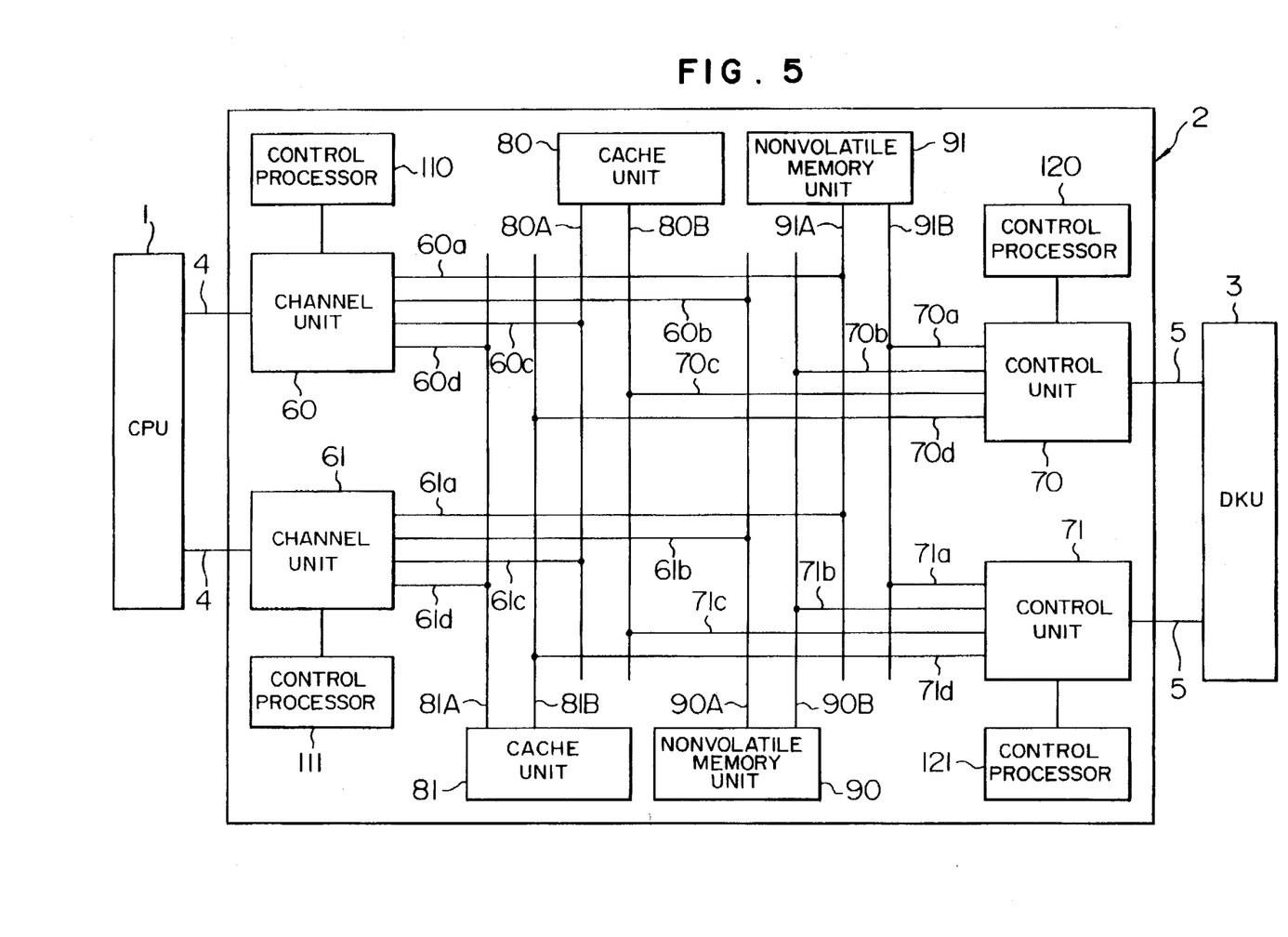
FIG. 5 shows a block diagram of a configuration of another embodiment of the external storage subsystem of the present inventions.

FIG. 5 shows a block diagram of another embodiment of the external storage subsystem of the present invention.

In this embodiment, each of the cache units 80 and 81 and the nonvolatile memory units 90 and 91 has a plurality of data buses 80A, 80B, 81A, 81B, 90A, 90B, 91A and 91B to each of which the channel units 60 and 61 and the control units 70 and 71 are independently connected through the access lines 60a to 60d, 61a to 61d, 70a to 70d and 71a to 71d.

The similar effects to those of the embodiment 1 are attained in this embodiment.

Figure 6:
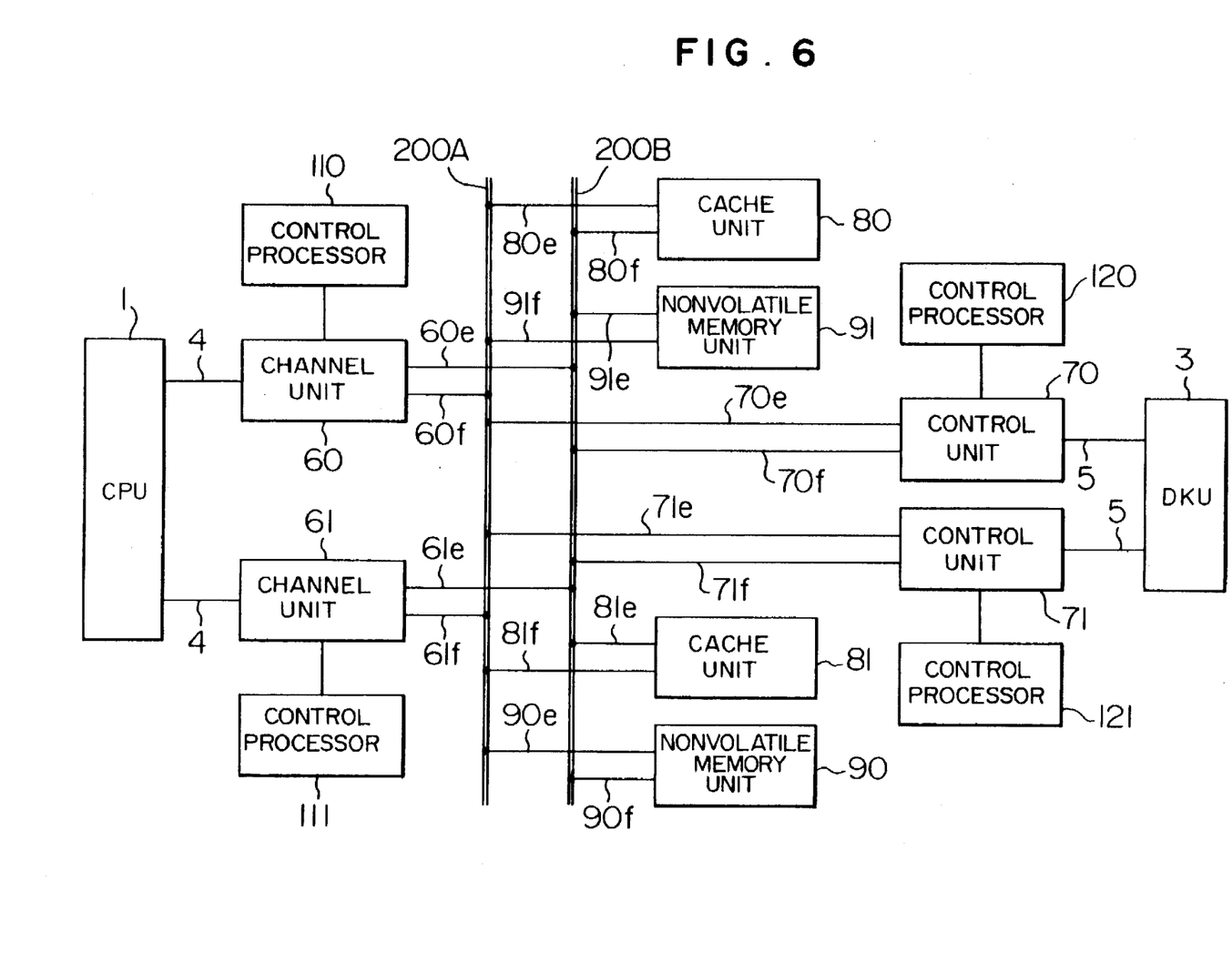
FIG. 6 shows a block diagram of an other embodiment of the external storage subsystem of the present invention.

FIG. 6 shows a block diagram of a configuration of another embodiment of the external memory subsystem of the present invention.

In this third embodiment, two common data buses 200A and 200B are provided. The channel unit 60 is connected to each bus through access lines 60e and 60f, the channel unit 61 is connected through access lines 61e and 61f, the control unit 70 is connected through access lines 70e and 70f, the control unit 71 is connected through access lines 71e and 71f, the cache unit 80 is connected through access lines 80e and 80f, the cache unit 81 is connected through access lines 81e and 81f, the nonvolatile memory unit 90 is connected through access lines 90e and 90f, and the nonvolatile memory unit 91 is connected through access lines 91e and 91f, independently respectively.

The similar effects to those of the previous embodiments are attained in this third embodiment.

Figure 7:
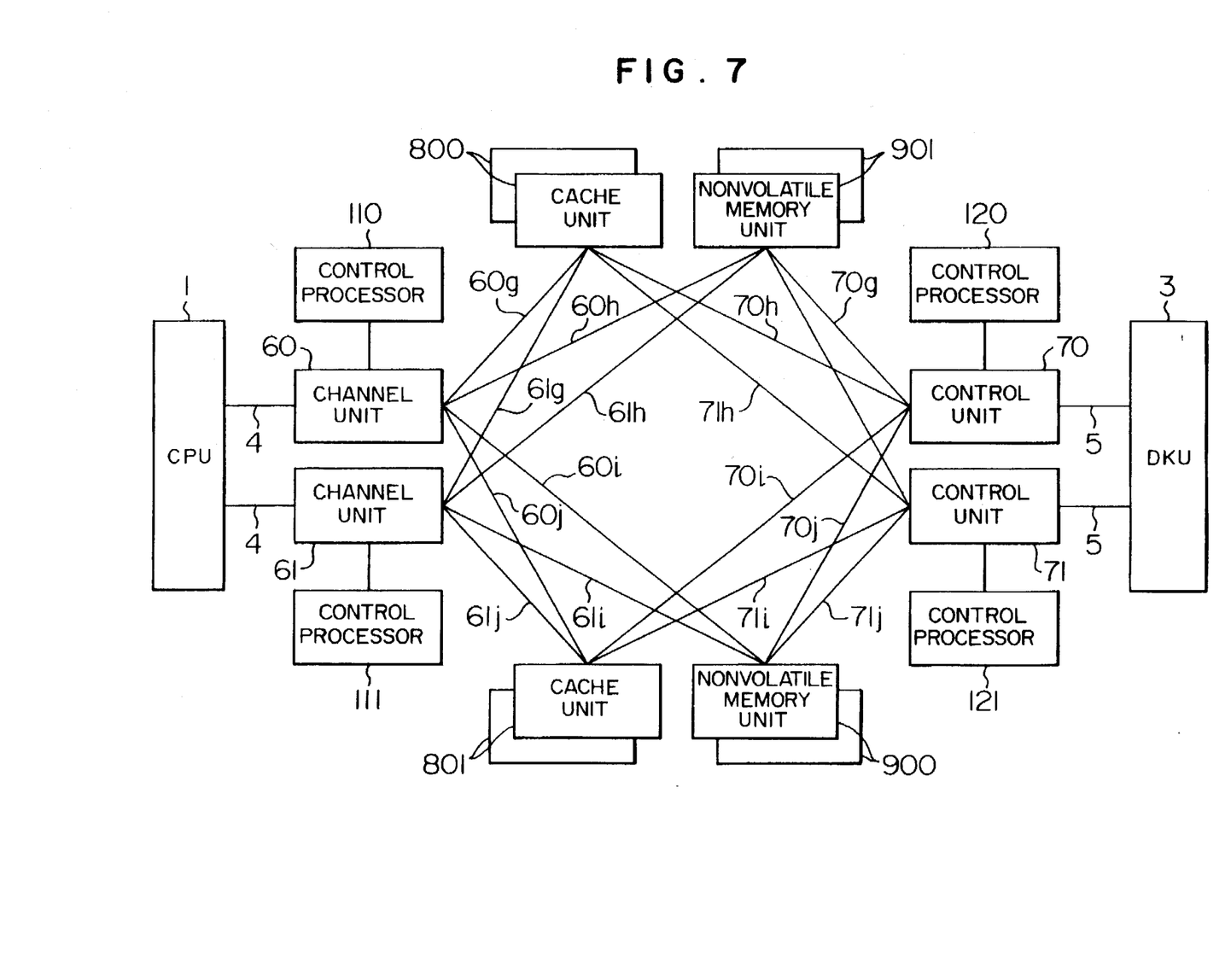
FIG. 7 shows a block diagram of a further embodiment of the external storage subsystem of the present invention.

FIG. 7 shows a block diagram of a configuration of a further embodiment of the external storage subsystem of the present invention.

In this fourth embodiment, cache unit groups 800 and 801 each comprising a plurality of cache units and nonvolatile memory unit groups 900 and 901 each comprising a plurality of nonvolatile memory units are provided. The cache unit groups 800 and 801 and the nonvolatile memory unit groups 900 and 901 are connected to the channel units 60 and 61 and the control units 70 and 71 through data buses 60g to 60j, 61g to 61j, 70g to 70j and 71g to 71j.

The similar effects to those of the previous embodiments are attained in this fourth embodiment.

While the present invention has been described with reference to the embodiments of the present invention, those embodiments are examples of the present invention and they may be modified in various ways without departing from the gist of the invention.

What is claimed is:

1. A storage subsystem comprising:
   a rotating storage device for storing data from a host and sending data to the host in response to a request from the host; and
   a memory controller including:
      a plurality of cache memories for temporarily storing the data transferred between the host and the rotating storage device,
      a plurality of channel units for controlling data transfer to and from the host,
   a plurality of control units for controlling data transfer to and from the rotating storage device, and
   a plurality of access paths for permitting independent access to the cache memories from the host and independent access to the cache memories from the rotating storage device, the plurality of access paths including a plurality of common data buses, each common data bus being coupled to each channel unit, each cache memory and each control unit, for controlling data transfer between the host and the rotating storage device,
      a first of said plurality of channel units having a first access line connected to a first of said plurality of data buses and a second access line connected to a second of said plurality of data buses,
      a first of said plurality of control units having a first access line connected to the first of said plurality of data buses and a second access line connected to the second of said plurality of data buses,
      a second of said plurality of channel units having a first access line connected to the first of said plurality of data buses and a second access line connected to the second of said plurality of data buses,
      a second of said plurality of control units having a first access line connected to the first of said plurality of data buses and a second access line connected to the second of said plurality of data buses, each of said plurality of cache memories having a first access line connected to the first data bus and a second access line connected to the second data bus.

2. The storage subsystem of claim 1, further comprising: a plurality of first control processors, each associated with one of said plurality of channel units, and a plurality of second control processors each associated with one of said plurality of control units, wherein access to said cache memories by said channel units and said control units is under the control of said first control processors and said second control processors respectively.

3. The storage subsystem of claim 1, wherein the plurality of cache memories includes at least two non-volatile semiconductor memories and two volatile semiconductor memories for temporarily storing the data transferred between the host and the rotating storage device.

4. The storage subsystem of claim 3, further comprising a plurality of first control processors, each associated with one of said plurality of channel units, and a plurality of second control processors each associated with one of said plurality of control units, wherein access to said cache memories by said channel units and said control units is under the control of said first control processors and said second control processors respectively.

5. A storage subsystem comprising:
a rotating storage device for storing data from a host and sending data to the host in response to a request from the host; and
a memory controller including:
a cache memory including at least two semiconductor memory banks for temporarily storing the data transferred between the host and the rotating storage device,
a plurality of channel units for controlling data transfer to and from the host,
a plurality of control units for controlling data transfer to and from the rotating storage device, and
a plurality of access paths for permitting independent access to the cache memory banks from the host and independent access to the cache memory banks from the rotating storage device, the plurality of access paths including a plurality of common data buses, each common data bus being coupled to each channel unit, each cache memory bank and each control unit, for controlling data transfer between the host and the rotating storage device,
a first of said plurality of channel units having a first access line connected to a first of said plurality of data buses and a second access line connected to a second of said plurality of data buses,
a first of said plurality of control units having a first access line connected to the first of said plurality of data buses and a second access line connected to the second of said plurality of data buses,
a second of said plurality of channel units having a first access line connected to the first of said plurality of data buses and a second access line connected to the second of said plurality of data buses,
a second of said plurality of control units having a first access line connected to the first of said plurality of data buses and a second access line connected to the second of said plurality of data buses,
each of said at least two semiconductor memory banks having a first access line connected to the first data bus and a second access line connected to the second data bus.

6. The storage subsystem of claim 5, further comprising:
a plurality of first control processors, each associated with one of said plurality of channel units, and a plurality of second control processors each associated with one of said plurality of control units, wherein access to said semiconductor memory banks by said channel units and said control units is under the control of said first control processors and said second control processors respectively.

7. The storage subsystem of claim 5, wherein the cache memory includes at least two non-volatile semiconductor memory banks and two volatile semiconductor memory banks for temporarily storing the data transferred between the host and the rotating storage device.

8. The storage subsystem of claim 7, further comprising a plurality of first control processors, each associated with one of said plurality of channel units, and a plurality of second control processors each associated with one of said plurality of control units, wherein access to said cache memory banks by said channel units and said control units is under the control of said first control processors and said second control processors respectively.

9. A storage subsystem comprising:
a rotating storage device storing data from a host and sending data to the host in response to a request from the host; and
a memory controller including:
a cache memory storing the data transferred between the host and the rotating storage device,
a plurality of channel units controlling data transfer to and from the host,
a plurality of control units controlling data transfer to and from the rotating storage device, and
a plurality of access paths permitting independent access to the cache memory from the host and independent access to the cache memory from the rotating storage device, the plurality of access paths including a plurality of common data buses, each common data bus being coupled to each channel unit, the cache memory and each control unit, the access paths controlling data transfer between the host and the rotating storage device,
each of said plurality of channel units having a plurality of access lines which are each connected to each of said plurality of common data buses,
each of said plurality of control units having a plurality of access lines which are each connected to each of said plurality of common data buses, and
said cache memory having a plurality of access lines which are each connected to each of said plurality of common data buses.

10. The storage subsystem of claim 9, further comprising:
a plurality of first control processors, each associated with one of said plurality of channel units, and a plurality of second control processors each associated with one of said plurality of control units, wherein access to said cache memories by said channel units and said control units is under the control of said first control processors and said second control processors respectively.

11. A storage subsystem comprising:
a rotating storage device storing data from a host and sending data to the host in response to a request from the host; and
a memory controller including:
a plurality of cache memories including at least two semiconductor memories storing the data transferred between the host and the rotating storage device, a plurality of channel units controlling data transfer to and from the host, a plurality of control traits controlling data transfer to and from the rotating storage device, and a plurality of access paths permitting independent access to the cache memories from the host and independent access to the cache memories from the rotating storage device, the plurality of access paths including a plurality of common data buses, each common data bus being coupled to each channel unit, each cache memory and each control unit, the access paths controlling data transfer between the host and the rotating storage device, each of said plurality of channel units having a plurality of access lines which are each connected to each of said plurality of common data buses, each of said plurality of control units having a plurality of access lines which are each connected to each of said plurality of common data buses, and each of said plurality of cache memories having a plurality of access lines which are each connected to each of said plurality of common data buses.

12. The storage subsystem of claim 11, further comprising:

a plurality of first control processors, each associated with one of said plurality of channel units, and a plurality of second control processors each associated with one of said plurality of control units, wherein access to said cache memories by said channel units and said control units is under the control of said first control processors and said second control processors respectively.

* * * * *